United States Patent
Otterstedt et al.

(10) Patent No.: US 11,062,761 B1
(45) Date of Patent: Jul. 13, 2021

(54) DIGITAL ADDRESS COMPENSATION FOR MEMORY DEVICES

(71) Applicant: Infineon Technologies AG, Neubiberg (DE)

(72) Inventors: Jan Otterstedt, Unterhaching (DE); Wolf Allers, Munich (DE); Christian Peters, Vaterstetten (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 16/740,893

(22) Filed: Jan. 13, 2020

(51) Int. Cl.
*G11C 11/4094* (2006.01)
*G11C 11/4074* (2006.01)
*G11C 11/408* (2006.01)
*G11C 11/4097* (2006.01)

(52) U.S. Cl.
CPC ...... *G11C 11/4094* (2013.01); *G11C 11/4074* (2013.01); *G11C 11/4085* (2013.01); *G11C 11/4097* (2013.01)

(58) Field of Classification Search
CPC .................................................. G11C 11/4094
See application file for complete search history.

(56) References Cited

U.S. PATENT DOCUMENTS

| | | | | |
|---|---|---|---|---|
| 6,229,737 B1* | 5/2001 | Walukas | ............... | G11C 11/005 365/185.11 |
| 8,645,656 B2* | 2/2014 | Yoon | ....................... | G06F 3/061 711/167 |
| 2009/0175112 A1* | 7/2009 | Ang | ....................... | G11C 16/30 365/226 |
| 2012/0239858 A1* | 9/2012 | Melik-Martirosian | ...................... | G11C 16/12 711/103 |
| 2014/0140130 A1* | 5/2014 | Song | ....................... | G11C 7/04 365/185.03 |
| 2019/0195690 A1* | 6/2019 | Ben-Shahar | .......... | G01J 3/2823 |

\* cited by examiner

*Primary Examiner* — Douglas King
(74) *Attorney, Agent, or Firm* — Cooper Legal Group, LLC

(57) ABSTRACT

A position of a memory cell to be accessed within a memory field of a memory device is identified. A region associated with the memory field within which the position is located is identified. A compensation parameter comprising a fixed electric step value for the region is identified. The compensation parameter may be selected from a set of compensation parameters or may be calculated based upon the position of the memory cell. The compensation parameter is applied to an action performed on a line connected to the memory cell during the access of the memory cell.

20 Claims, 9 Drawing Sheets

DIGITAL ADDRESS COMPENSATION FOR MEMORY DEVICES

TECHNICAL FIELD

The present disclosure relates to the field of memory devices and particularly to digital address compensation for memory devices.

BACKGROUND

A memory device comprises memory fields and support circuitry used to operate memory cells within the memory fields. In an example, the memory cells within a memory field may be arranged in a matrix fashion. A memory cell is selected using lines, such as orthogonal metal lines. For example, the memory cell may be selected using bitlines and wordlines, where bitlines and wordlines are orthogonal to one another and memory cells are located at respective intersections of bitlines and wordlines. A memory cell is accessed by acting upon a bitline and a wordline that intersect at the memory cell. With some types of memory devices, the memory cell may also be accessed using sourcelines.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

One type of memory device is a resistive random-access memory (RRAM) device. Memory fields within a RRAM device may have two types of topologies. A first topology (a one-sided topology) is where bitline drivers and sourceline drivers, used to drive currents through bitlines and sourcelines of the memory field, are located on a same side of a memory field such as at a bottom side of the memory field. A second topology (an opposing two-sided topology where bitline and sourceline drivers are located at opposing sides of the memory field) is where the bitline drivers and the sourceline drivers are located at different sides (e.g., opposite sides) of the memory field, such as where the bitline drivers are located at the bottom side of the memory field and the sourceline drivers are located at a top side of the memory field. A third topology (an orthogonal two-sided topology where bitline drivers and sourceline drivers are located orthogonal to each other) is where the bitlines and sourcelines are orthogonal to one another and thus the bitline drivers and the sourceline drivers are located at adjacent edges of the memory field, such as where the bitline drivers are located at the bottom side of the memory field and the sourceline drivers are located at a right side of the memory field.

When programming a memory cell, a relatively high current (e.g., 300 uA or any other current) must be driven through the memory cell. This high current generates a voltage drop on a feed line, such as a bitline and/or a sourceline. If the voltage drop is too high such as due to high resistance of the feed line, then the voltage drop must be taken into account during programming for correct operation. Otherwise, the memory cell may be programmed incorrectly, such as where the relatively high current needed to change a state of the memory cell during programming is not reached and thus the state is not changed correctly. In this way, a resistance of the feed line, which can vary based upon a length of the feed line and a line type of the feed line (e.g., a bitline and a sourceline may have different resistances) can affect correct operation The length of a particular conducting path to a memory cell can thus affect the ability to correctly program the memory cell. For example, a longer conducting path may have a greater resistance that needs to be taken into account when attempting to apply a target current needed to program the memory cell. This becomes problematic because different memory cells can have different conducting path lengths. The varying conducting path lengths lead to varying resistances along different conducting paths, thus resulting in different voltage drops that must be taken into account. For example, a first memory cell located relatively close to a bitline driver and a sourceline driver of a memory field of a memory device having the first topology (the one-sided topology) or third topology (the orthogonal two-sided topology) may have a relatively shorter conducting path between the bitline driver and the sourceline driver for the first memory cell than a second memory cell located further from the bitline driver and the sourceline driver. Thus, different voltages would have to be applied by e.g. the bitline driver to the bitline to program the first memory cell and the second memory cell in order to achieve a target current (e.g., the 300 uA current) needed for programming the memory cells. Even for a memory device having the second topology (the two-sided topology) where the conducting path may be relatively similar in length, resistances along conducting paths can differ because bitlines and sourcelines may have different resistances and because conducting paths may encompass differing lengths of bitlines and sourcelines. Again, correct programming of the memory cell would have to take this variance into account. Without the ability to compensate for varying resistances and conducting path lengths, the length of bitlines and sourcelines must remain short (e.g., a vertical height of a memory field would have to be small). Thus, more, smaller, memory fields would have to be built to keep bitlines and/or sourcelines relatively short, which is not area efficient.

In an embodiment of the techniques presented herein, a method is provided for digital address compensation for memory devices. The method includes identifying a position of a memory cell to be accessed within a memory field. The method includes identifying a region associated with the memory field within which the position is located. The method includes determining a compensation parameter from a set of compensation parameters comprising fixed electrical value steps for regions associated with the memory field based upon the compensation parameter corresponding to the region. The method includes applying the compensation parameter to an action performed on a line connected to the memory cell during the access of the memory cell.

In an embodiment of the techniques presented herein, an apparatus is provided for digital address compensation for memory devices. The apparatus includes a means for identifying a position of a memory cell to be accessed within a memory field. The apparatus includes a means for identifying a region associated with the memory field within which the position is located. The apparatus includes a means for determining a compensation parameter from a set of compensation parameters comprising fixed electrical value steps for regions associated with the memory field based upon the compensation parameter corresponding to the region. The apparatus includes a means for applying the compensation parameter to an action performed on a line connected to the memory cell during the access of the memory cell In an embodiment of the techniques presented herein, a memory device is provided. The memory device comprises a memory field comprising a plurality of memory cells. The memory device comprises a compensation device. The compensation device is configured to identify a position of a memory cell to be accessed within the memory field. The compensation device is configured to calculate a compensation parameter based upon the position, wherein the compensation parameter comprises a calculated fixed electrical value out of a set of calculated fixed electrical values. The compensation device is configured to apply the compensation parameter to an action performed on a line connected to the memory cell during access of the memory cell.

In an embodiment of the techniques presented herein, a method is provided for digital address compensation for memory devices. The method includes identifying a position of a memory cell to be accessed within a memory field of a memory device. The method includes determining a compensation parameter based upon the position, wherein the compensation parameter comprises a calculated fixed electrical value. The method includes applying the compensation parameter to an action performed on a line connected to the memory cell during access of the memory cell.

In an embodiment of the techniques presented herein, an apparatus is provided for digital address compensation for memory devices. The apparatus includes a means for identifying a position of a memory cell to be accessed within a memory field of a memory device. The apparatus includes a means for determining a compensation parameter based upon the position, wherein the compensation parameter comprises a calculated fixed electrical value. The apparatus includes a means for applying the compensation parameter to an action performed on a line connected to the memory cell during access of the memory cell.

To the accomplishment of the foregoing and related ends, the following description and annexed drawings set forth certain illustrative aspects and implementations. These are indicative of but a few of the various ways in which one or more aspects may be employed. Other aspects, advantages, and novel features of the disclosure will become apparent from the following detailed description when considered in conjunction with the annexed drawings.

DETAILED DESCRIPTION

Figure 1:
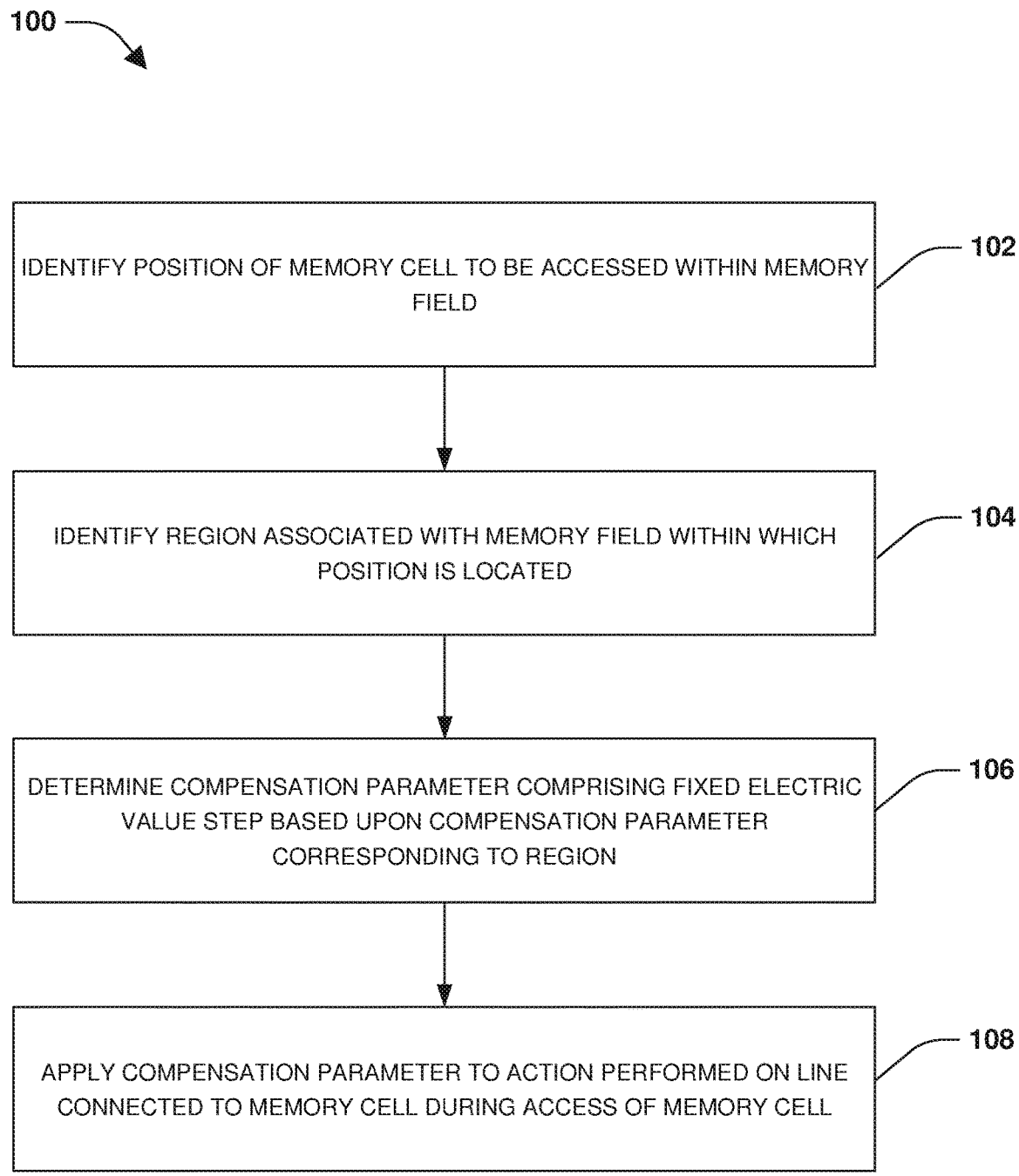
FIG. 1 is an illustration of an example method of digital compensation address compensation for a memory device.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

Within the field of electronics, a memory device comprises memory fields of memory cells. A memory field comprises an array of memory cells that can individually represent one or more states, such as a logical "1", a logical "0", or any other state. The memory cells are connected to lines, such as bitlines and wordlines. With some types of memory devices, the memory cells are also connected to sourcelines. The memory device may comprise bitline drivers and sourceline drivers that drive currents along conducting paths to a particular memory cell that is to be access, such as written to or read from. The bitline drivers and/or the sourceline drivers may be arranged according to various topologies.

In a one-sided topology, the bitline drivers and the sourceline drivers are located on the same side of a memory field. Because the bitline drivers and sourceline drivers are located on the same side of the memory field, the distance of conducting paths to different memory cells may be different based upon how far away each memory cell is from a bitline driver and a sourceline driver. If access to a target memory cell requires a particular target current (e.g., 300 uA or any other current value to program the target memory cell), then different voltage differences between bitline drivers and sourceline drivers would need to be applied for memory cells having differing conducting paths in order to achieve the same target current because conducting paths of different lengths will have different resistances. For example, a relatively lower voltage difference between a first bitline driver and a first sourceline driver would be applied to achieve the target current of 300 uA for a first memory cell along a bottom wordline located close to a location of the first bitline driver and first sourceline driver because of the relatively shorter conducting path of memory cells connected to the bottom wordline near the drivers. A relatively higher voltage difference between the first bitline driver and the first sourceline driver would be applied to achieve the target current of 300 uA for a second memory cell along a top wordline located far from the location of the first bitline driver and the first sourceline driver because of the relatively shorter conducting path of memory cells connected to the top wordline located far from the drivers. This is because of different voltage drops (IR drops) will occur along conducting paths of differing lengths and resistances. Without taking this into account, an action performed upon a memory cell may not be performed correctly (e.g., a memory cell fails to correctly change a state during programming because the target current is never achieved due to a large resistance along a relatively longer conducting path to the memory cell).

In a two-sided topology, the bitline drivers and the sourceline drivers are located on different sides of the memory field such as opposing sides. With the two-sided topology, the conducting paths may be similar in length, but due to variances in resistances between bitlines and sourcelines, the resistance along conducting paths to different memory cells can differ. Similarly, the differences in resistance would have to be taken into account in order correctly perform an action upon a memory cell, such as to achieve the target current needed to program the memory cell. Otherwise, operation of the memory device would be adversely affected due to positional differences amongst memory cells within a memory field, such as where programming of a memory cell fails because a target current needed to program the memory cell is not achieved due to a large voltage drop and/or higher resistance of a conducting path to that memory cell compared to other memory cells. Thus, more, smaller, memory fields would have to be built to keep bitlines and/or sourcelines relatively short, which is not area efficient.

In an orthogonal two-sided topology, the bitline drivers and the sourceline drivers are located on adjacent sides of the memory field. Similar to the one-sided topology, the distance of conducting paths to different memory cells may be different based upon how far away each memory cell is from a bitline driver and a sourceline driver. The necessary voltage here would not only vary with the location of the wordline a memory cell is connected to, but also with the position of the memory cell on this wordline, since the distance to the bitline driver would vary with the wordline location whereas the distance to the sourceline driver would vary with the location of the memory cell on this wordline.

As provided herein, digital compensation is provided for memory cells as a function of positional locations of each memory cell, which may be implemented by a compensation device (e.g., software, hardware, a finite state machine, a programmable CPU, fixed logic, a field programmable gate array (FPGA), or combination thereof). In particular, a digital compensation parameter to apply to an action being performed upon a memory cell is selected or calculated based upon a location of the memory cell within a memory field. The digital compensation parameter may correspond to a fixed value step, such as a fixed voltage step, a fixed current step, a fixed time step, or other parameter within a digital domain. In an embodiment, a voltage applied to a memory cell may be increased or decreased by a certain number of fixed voltage steps (e.g., 60 mV steps). In an embodiment, a current, applied by a driver such as a bitline driver or sourceline driver, to the memory cell may be increased or decreased by a certain number of fixed current steps. In an embodiment, a timespan before a function is to be performed (e.g., a wait time until a voltage is applied to a line connected to the memory cell) is increased or decreased by a certain number of fixed time steps. In this way, the compensation parameter is applied to an action (e.g., a read operation, a write operation) performed on a line (e.g., a bitline, a sourceline, a wordline, or a combination thereof) connected to the memory cell during access of the memory cell.

Various techniques may be employed for determining the compensation parameter. In an embodiment, a position of a memory cell to be access is determined. The position may correspond to a position of the memory cell along a line, such as a particular wordline, sourceline, and/or bitline. The compensation parameter may be calculated (e.g., on the fly in response to a request to access the memory cell) based upon the position of the memory cell. In an embodiment, the position of the memory cell is used to determine a region of the memory field within which the position is located. For example, the memory field may be segmented into 4 regions or any other number of regions. Each region may correspond to a particular compensation parameter (e.g., a first region close to a bitline driver may have a zero compensation parameter, a second region further from the bitline driver may have a 60 mV compensation parameter, a third region even further from the bitline driver may have a 120 mV compensation parameter, and a fourth region furthest from the bitline driver may have a 180 mV compensation parameter). Thus, the region may be used to select the compensation parameter from a set of compensation parameters comprising fixed electrical value steps mapped to regions within the memory field based upon the compensation parameter being mapped to the region. In this way, the compensation parameter may be calculated/selected, and then applied to an action performed on a line connected to the memory cell.

The ability to select or calculate a compensation parameter based upon a location of a memory cell upon which an action is to be performed helps ensure correct operation of the action, such as driving a target current through the memory cell during programming. Thus, the location of memory cells within a memory field are taken into account in order to improve the operation of the memory device. Furthermore, larger memory fields can be created with longer lines, such as longer bitlines, to achieve the same storage space that would otherwise require numerous smaller memory fields with shorted lines. Using fewer large memory fields is more area efficient than using a larger number of smaller memory fields while providing the same storage capacity with improved reliability of executing actions. This allows for smaller memory devices with improved operation.

Figure 2:
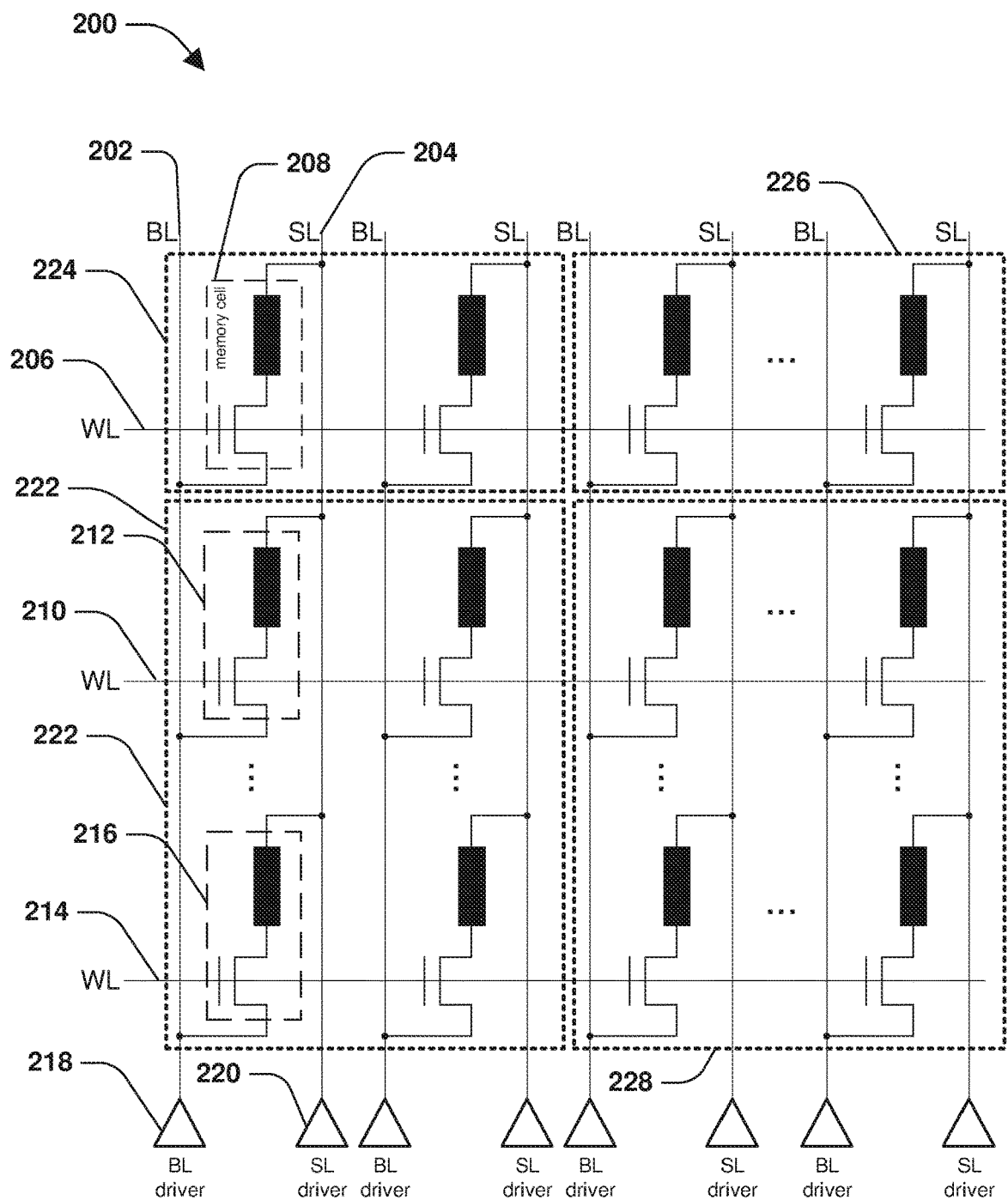
FIG. 2 is a component block diagram illustrating a memory device having a one-sided connection of drivers.

An embodiment of digital compensation for memory cells as a function of positional locations of each memory cell is illustrated by an exemplary method 100 of FIG. 1 and further described in conjunction with FIGS. 2-5. In an embodiment, the digital compensation may be performed by a compensation device (e.g., software, hardware, a finite state machine, a programmable CPU, fixed logic, a field programmable gate array (FPGA), or combination thereof). It may be appreciated that the method 100 of providing digital compensation for memory cells may be implemented for any type of memory device such as a resistive random access memory (RRAM), and is not limited to the examples provided herein. FIG. 2 is an embodiment of a memory device 200 for which digital compensation may be provided for memory cells within the memory device 200. The memory device 200 is configured according to a one-sided topology where bitline drivers and source drivers are located at the same side of the memory device 200, such as where a first bitline driver 218 and a first sourceline driver 220 are located at a bottom side of the memory device 200.

The memory device 200 comprises one or more memory fields. Each memory field comprises memory cells, such as a first memory cell 208, a second memory cell 212, a third memory cell 216, and/or other memory cells, which may be arranged according to a grid layout or any other arrangement. The memory cells are connected to one or more lines, such as wordlines, bitlines, and/or sourcelines. In an embodiment, the first memory cell 208 is connected to a first bitline 202, a first sourceline 204, and a third wordline 206. The second memory cell 212 is connected to the first bitline 202, the first sourceline 204, and a second wordline 210. The third memory cell 216 is connected to the first bitline 202, the first sourceline 204, and a first wordline 214. A memory cell can individually represent one or more states, such as a logical "1", a logical "0", or any other state based upon a property of the memory cell. For example with RRAM, an electric current is applied to a material within a memory cell, which changes the resistance of the memory cell. The resistance state of the memory cell can be measured and read as either a logical "1", a logical "0" or any other state. With other types of memory devices, a memory cell may store a charge that is read as either a logical "1", a logical "0" or any other state.

In an embodiment, an intersection of a bitline and a wordline is used to address a particular memory cell at the intersection. For example, an intersection of the first bitline 202 and the first wordline 214 may be used to address the third memory cell 216. When accessing a memory cell, such as when programming the third memory cell 216, a first bitline driver 218 connected to the first bitline 202 and/or a first sourceline driver 220 connected to the first sourceline 204 may be used to drive an electric charge through a first conducting path that is along the first bitline 202, through the third memory cell 216, and along the first sourceline 204. A target current (e.g., 300 uA or any other current) may be required in order to correctly program the third memory cell 216. Because the conducting path from the first bitline driver 218 along the first bitline 202 to the third memory cell 216 and then along the first sourceline 204 to the first sourceline driver 220 is relatively short, a relatively smaller voltage difference would need to be applied between the first bitline driver 218 and the first sourceline driver 220 in order to achieve the target current and correctly program the third memory cell 216. In contrast, a relatively larger voltage difference would need to be applied between the first bitline driver 218 and the first sourceline driver 220 to achieve the target current and correctly program the first memory cell 208 because a conducting path from the first bitline driver 218 along the first bitline 202 to the first memory cell 208 and then along the first sourceline 204 to the first sourceline driver 220 is relatively longer.

In order to ensure correct operation of the memory device 200, such as achieving the target current required to correctly program a memory cell, a compensation parameter is selected/calculated based upon a position of a target memory cell, and the compensation parameter is applied to an action performed upon the target memory cell. In an embodiment, a memory field, comprising a plurality of memory cells of the memory device 200, is logically segmented into regions depicted by dashed lines, such as a first region 222 encompassing the third memory cell 216, the second memory cell 212, and/or other memory cells, a second region 224 encompassing the first memory cell 208 and/or other memory cells, a third region 228 encompassing one or more memory cells, a fourth region 226 encompassing one or more memory cells, and/or other regions not depicted. It may be appreciated that any number of regions, any shape of regions, and/or any size of regions (e.g., a number of memory cells encompassed by a region, which may be the same or different across regions) may be defined within the memory field.

In an embodiment, a set of compensation parameters are defined for the regions. Each region may be assigned a particular compensation parameter. In an embodiment, each compensation parameter has a different value. In an embodiment, one or more compensations parameters may have the same value, while other compensation parameters have different values. In an embodiment, one or more compensation parameters have a zero value, while other compensations parameters have non-zero values. In an embodiment, all compensation parameters have non-zero values. The set of compensation parameters comprise fixed electrical value steps that are defined in a digital domain. In an embodiment, the set of compensation parameters are fixed voltage steps corresponding to increases or decreases of voltage applied to a memory field by a number of voltage steps. In an embodiment, the set of compensation parameters are fixed current steps corresponding to increases or decreases of current applied by a driver, such as the first bitline driver 218 or the first sourceline driver 220 to the memory field by a number of current steps. In an embodiment, the set of compensation parameters are fixed time steps (e.g., fixed counter values) corresponding to increases or decreases of time by a number of time steps. When an action is to be performed upon a memory cell within the memory field, then a compensation parameter mapped to a region within which the memory cell is located is identified and applied to the action.

A value of a compensation parameter for a region may be determined as a function of a location of the region in order to take into account a length and/or resistance of a conducting path used to access memory cells within the region. That is, conducting paths to memory cells within different regions may have different conducting path lengths, resistances, and/or other differing properties that can affect correct operation of accessing the memory cells. For example, during programming of a memory cell, a target current must be applied to the memory cell in order to successfully change a state of the memory cell. Varying lengths and/or resistances of conducting paths can affect the ability to successfully apply the target current. Accordingly, the compensation parameter may correspond to an increase or decrease in a value, such as a current value, a voltage value, or a time value, used to compensate for the particular properties of a conducting path so that the target current is achieved for correct operation. For example, a larger compensation parameter may be set for regions having longer conducting paths in order to compensate for increased resistance and/or lengths of the conducting paths to memory cells within those regions.

In an embodiment of applying a compensation parameter to an action, a position of a memory cell to be accessed within a memory field is identified, at 102. In an embodiment, the action corresponds to a read operation to read a value from the first memory cell 208. In an embodiment, the action corresponds to a write operation to write a value into the first memory cell 208. The position may be determined based upon an address specified by the action. The address may correspond to a particular wordline and/or a particular bitline that intersect with the first memory cell 208. For example, the position may correspond to the intersection of the first bitline 202 and the third wordline 206.

At 104, a region, associated with the memory field within which the position is located, is identified. In an embodiment, the address, corresponding to the intersection of the first bitline 202 and the third wordline 206 at which the first memory cell 208 is located, is mapped to the second region 224. Accordingly, the second region 224 is identified as being the region within the memory field at which the position of the first memory cell 208 is located.

At 106, a compensation parameter is selected from the set of compensation parameters based upon the compensation parameter being mapped to the region. In an embodiment, a lookup table is queried using the second region 224 to determine that a particular compensation parameter is mapped to the second region 224 within the lookup table. The compensation parameter comprises a fixed electrical value step to apply to the action targeting the first memory cell 208. In an embodiment, the compensation parameter may be determined (e.g., modified as a function of temperature) based upon a temperature value associated with the memory field.

At 108, the compensation parameter is applied to the action performed on a line connected to the memory cell during access of the memory cell. In an embodiment, the compensation parameter is applied to the first bitline 202 connected to the first memory cell 208 (e.g., a voltage step, a current step, or a time step is applied to an action performed over the first bitline 202). In an embodiment, the compensation parameter is applied to the first sourceline 204 connected to the first memory cell 208 (e.g., a voltage step, a current step, or a time step is applied to an action performed over the first sourceline 204). In an embodiment, the compensation parameter is applied to the third wordline 206 connected to the first memory cell 208 (e.g., a voltage step, a current step, or a time step is applied to an action performed over the third wordline 206).

In an embodiment, additional compensation parameters are applied to actions over other lines connected to the first memory cell 208 during performance of the action. For example, if the compensation parameter was applied to the first bitline 202, then the compensation parameter or a different compensation parameter may be identified and applied to the third wordline 206 and/or the first sourceline 204 connected to the first memory cell 208. That is, the position of the first memory cell 208 comprises a first spatial position along a first spatial dimension (e.g., a horizontal direction, a vertical direction, a direction of the line connected to the first memory cell 208 such as a direction of the first bitline 202). The region comprises a first spatial region, and thus the compensation parameter comprises a first spatial compensation parameter to apply to the first spatial dimension. A second spatial position of the first memory cell 208 along a second spatial dimension. The second spatial dimension may or may not be perpendicular to the first spatial dimension is identified, in an embodiment. A second spatial region of the memory field within which the second spatial position is located is identified. A second spatial compensation parameter is determined based upon the second spatial region. The second spatial compensation parameter is applied to an action performed on a second line (e.g., the third wordline 206) connected to the first memory cell 208. In an embodiment, additional compensation may be applied to the first line (e.g., adding up compensations for the bitline based on both spatial positions).

Other compensation parameters with different values may be applied to actions accessing other memory cells in other regions of the memory field in order to compensate for different resistances and/or lengths of conducting paths to those memory cells in comparison with the first memory cell 208. For example, a second action is to be performed upon the third memory cell 216, which has a shorter conducting path between the first bitline driver 218 and the first sourceline driver 220 and through the third memory cell 216 than the longer conducting path between the first bitline driver 218 and the first sourceline driver 220 and through the first memory cell 208. Accordingly, a second position of the third memory cell 216 is identified. The first region 222 is identified as the region within which the second position of the third memory cell 216 is located. A second compensation parameter is selected from the set of compensation parameters based upon the second compensation parameter being mapped to the first region 222. Accordingly, the second compensation parameter is applied to the second action being performed along a line connected to the third memory cell 216. In an embodiment, because the length and/or resistance of the conducting path for the third memory cell 216 is much shorter/smaller than the length and/or resistance of the conducting path for the first memory cell 208, the second compensation parameter may have a relatively smaller fixed electric step value than the compensation parameter applied to the action targeting the first memory cell 208. In this way, different compensation parameters can be applied for actions targeting memory cells at different locations to compensate for variances otherwise occurring from positional differences of the memory cells.

Figure 3A:
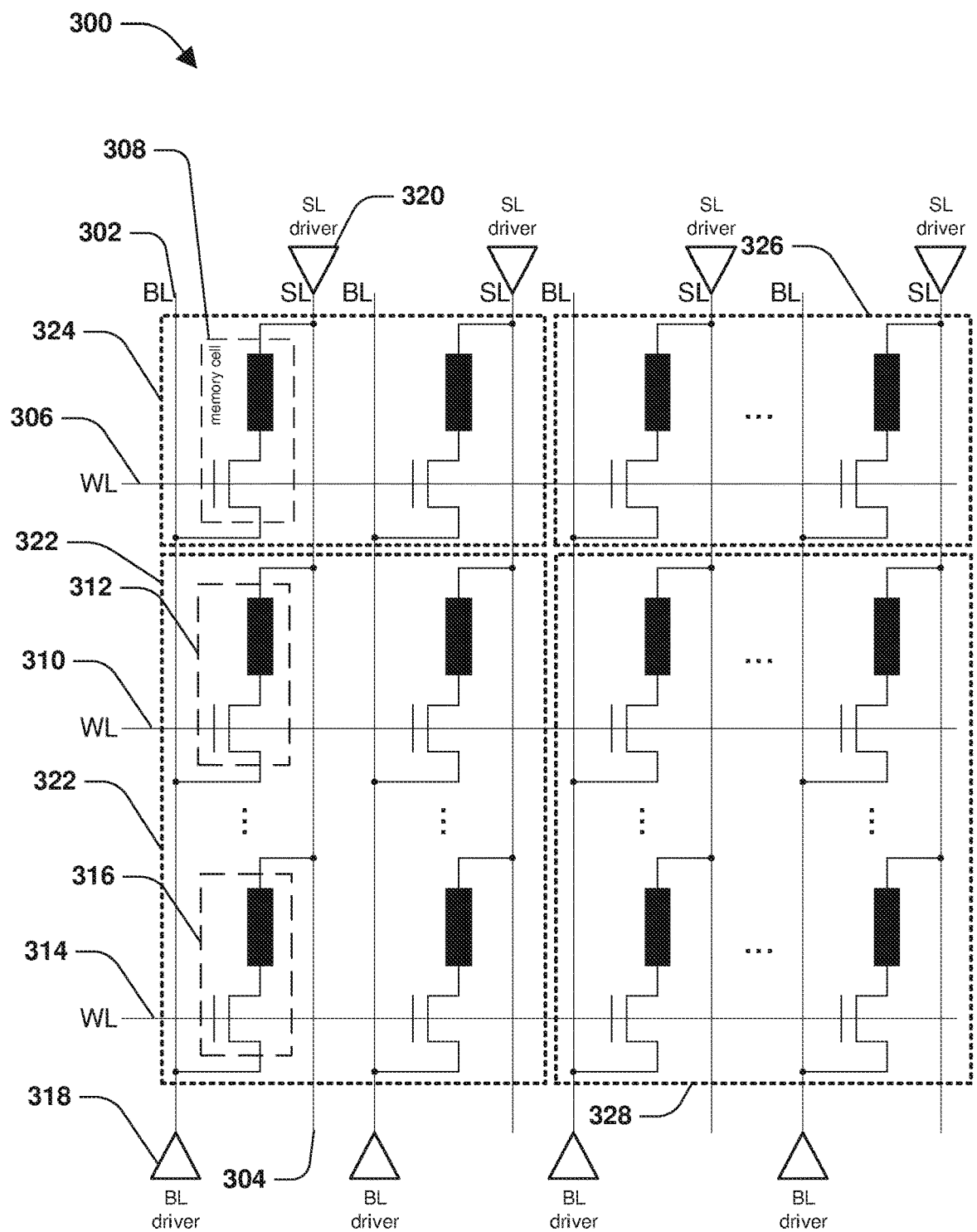
FIG. 3A is a component block diagram illustrating a memory device having an opposing two-sided connection of drivers.

FIG. 3A is an embodiment of a memory device 300 for which digital compensation may be provided for memory cells within the memory device 300. The memory device 300 is configured according to an opposing two-sided topology where bitline drivers and source drivers are located at different sides of the memory device 300, such as where a first bitline driver 318 and a first sourceline driver 320 are located at opposing sides of the memory device 300.

The memory device 300 comprises one or more memory fields. Each memory field comprises memory cells, such as a first memory cell 308, a second memory cell 312, a third memory cell 316, and/or other memory cells, which may be arranged according to a grid layout or any other arrangement. The memory cells are connected to one or more lines, such as wordlines, bitlines, and/or sourcelines. In an embodiment, the first memory cell 308 is connected to a first bitline 302, a first sourceline 304, and a third wordline 306. The second memory cell 312 is connected to the first bitline 302, the first sourceline 304, and a second wordline 310. The third memory cell 316 is connected to the first bitline 302, the first sourceline 304, and a first wordline 314. Even though conducting paths between the first bitline driver 318 and the first sourceline driver 320 through any of the memory cells connected to the first bitline 302 and the first sourceline 304 are relatively the same length, resistances along each conducting path may vary due to resistivity variances between the first bitline 302 and the first sourceline 304. For example, a resistance of the first bitline 302 is different than a resistance of the first sourceline 304. Thus, a conducting path through the first memory cell 308 will have a different resistance than a conducting path through the third memory cell 316 because the conducting path through the first memory cell 308 spans a differing lengths of the first bitline 302 and the first sourceline 304 than the conducting path through the third memory cell 316.

Accordingly, compensation parameters may be identified and used to compensate for the differences in resistivity along conducting paths to memory cells in different locations within the memory device 300 in order to ensure correct operation of the memory device (e.g., ensure a target current is still achieved for correctly programming a memory cell). In an embodiment, a memory field of the memory device 300 is segmented into regions, such as a first region 324, a second region 322, a third region 326, and a fourth region 328. Compensation parameters are calculated for each region, and are mapped to each region such as within a lookup table. The compensation parameters may comprise fixed electrical value steps in a digital domain that can be applied to actions along lines (e.g., voltage steps, current steps, and/or time steps that can be applied to bitlines, wordlines, sourcelines, etc.) to compensate for variances of resistivity along conducting paths to target memory cells at differing locations within the memory field.

Figure 3B:
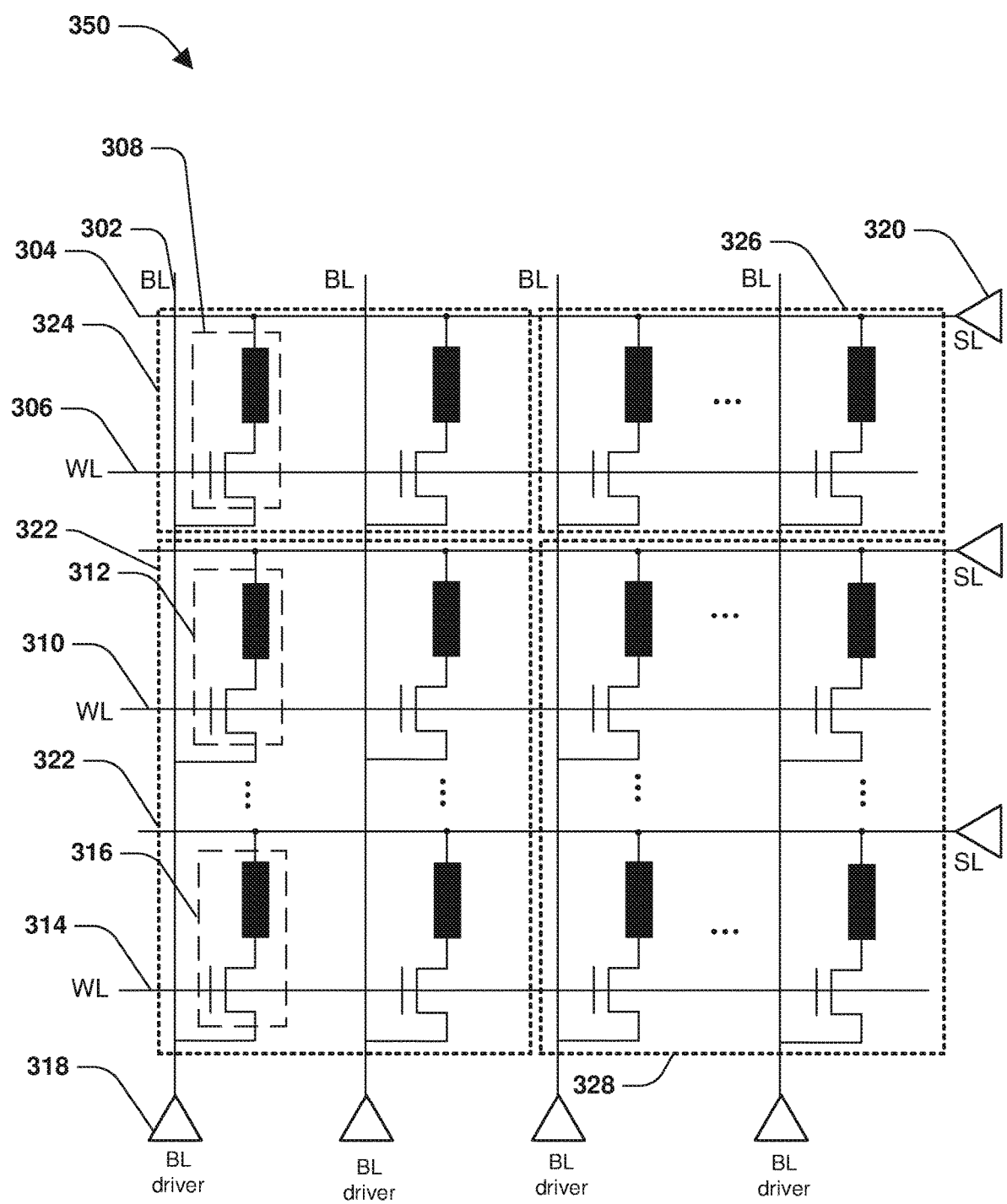
FIG. 3B is a component block diagram illustrating a memory device having an orthogonal two-sided connection of drivers.

FIG. 3B is an embodiment of a memory device 350 for which digital compensation may be provided for memory cells within the memory device 350. The memory device 350 is configured according to an orthogonal two-sided topology where bitlines (e.g., the first bitline 302) and sourcelines (e.g., the first sourceline 304) are orthogonal to one another and thus the bitline drivers (e.g., the first bitline driver 318) and the sourceline drivers (e.g., the first sourceline driver 320) are located at adjacent edges of the memory field, such as where the bitline drivers are located at the bottom side of the memory field and the sourceline drivers are located at a right side of the memory field. A position of a memory cell comprises a first spatial position along a first spatial dimension (e.g., a vertical direction of the first bitline 302) and a second spatial position along a second spatial dimension (e.g., a horizontal direction of the first sourceline 304). Compensation parameters may be applied to actions performed along the first spatial dimension and/or the second spatial dimension.

Figure 4:
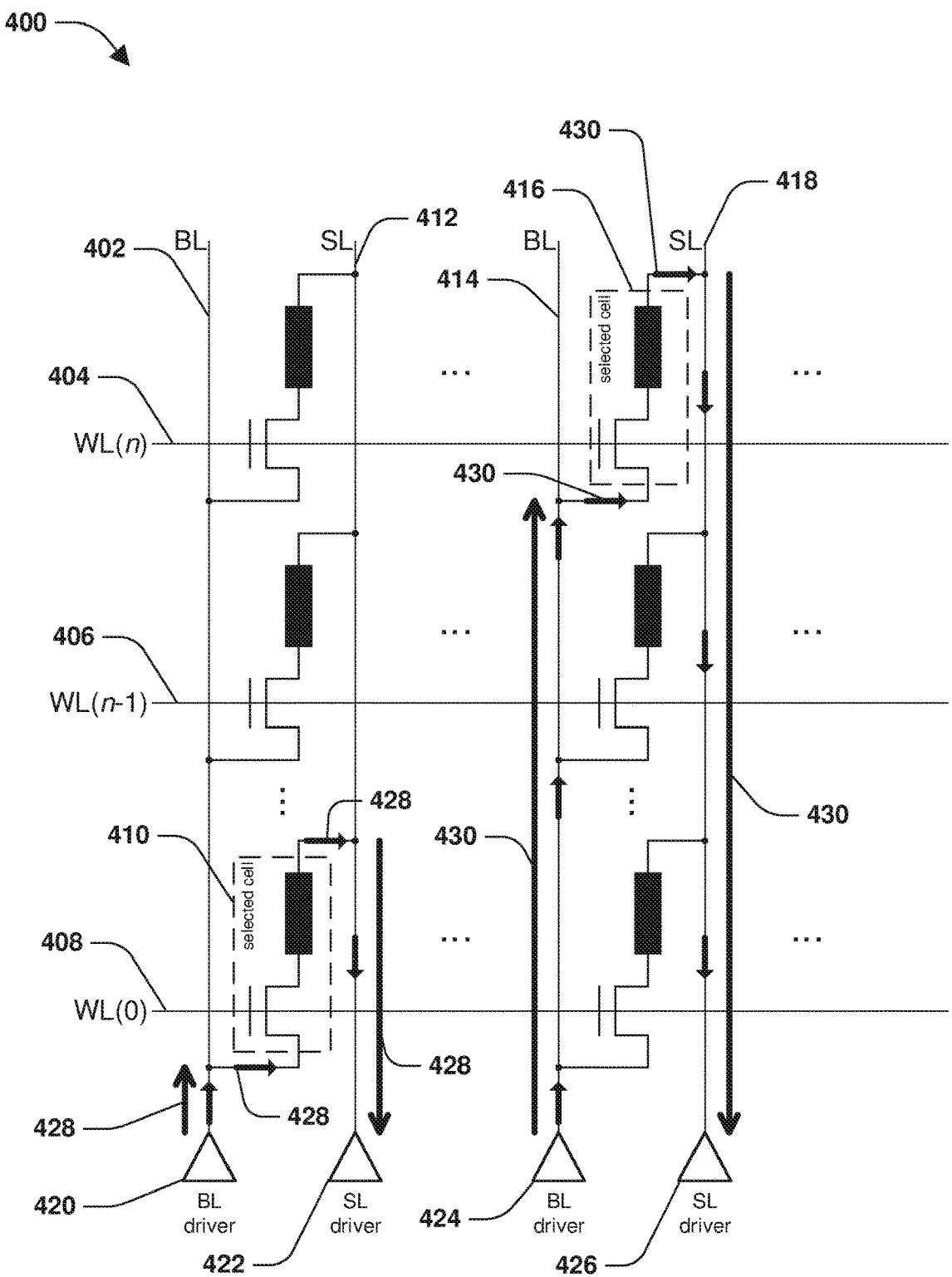
FIG. 4 is a component block diagram illustrating a memory device having a one-sided connection of drivers.

FIG. 4 is an embodiment of a memory device 400 for which digital compensation may be provided for memory cells within the memory device 400. The memory device 400 is configured according to a one-sided topology where bitline drivers and source drivers are located at the same side of the memory device 400, such as where a first bitline driver 420, a first sourceline driver 422, a second bitline driver 424, and a second sourceline driver 426 are located at a bottom side of the memory device 400. The memory device 400 comprises wordlines, bitlines, and sourcelines connected to memory cells within a memory field of the memory device 400. In an embodiment, the memory device 400 comprises a first wordline 408, a second wordline 406, a third wordline 404, and/or other wordlines not illustrated. In an embodiment, the memory device 400 comprises a first bitline 402 connected to the first bitline driver 420, a second bitline 414 connected to the second bitline driver 424, and/or other bitlines not illustrated. In an embodiment, the memory device 400 comprises a first sourceline 412 connected to the first sourceline driver 422, a second sourceline 418 connected to the second sourceline driver 426, and/or other sourcelines not illustrated.

The memory device 400 comprises one or more memory fields of memory cells. In an embodiment, a memory field comprises a first memory cell 410 connected to the first wordline 408, the first bitline 402, and the first sourceline 412. The memory field comprises a second memory cell 416 connected to the third wordline 404, the second bitline 414, and the second sourceline 418. The memory field may comprise any number of memory cells.

Lengths of conducting paths can vary amongst the memory cells within the memory field. In an embodiment, a first conducting path 428 for the first memory cell 410 is a relatively shorter conducting path between the first bitline driver 420 and the first sourceline driver 422 and through the first memory cell 410. A second conducting path 430 for the second memory cell 416 is a relatively longer conducting path between the second bitline driver 424 and the second sourceline driver 426 and through the second memory cell 416. These differences in conducting path lengths must be taken into account when actions are performed upon memory cells in order to ensure correct operation of the actions. In an embodiment, the differences of conducting path lengths must be taken into account when programming a memory cell to ensure a target current needed to correctly program the memory cell is achieved. For example, a relatively lower voltage difference needs to be applied between the first bitline driver 420 and the first sourceline driver 422 when performing an action upon the first memory cell 410 than a voltage difference applied between the second bitline driver 424 and the second sourceline driver 426 when performing an action upon the second memory cell 416 in order to achieve the target current. This is because the first conducting path 428 of the first memory cell 410 is shorter (e.g., and/or has less resistance) than the second conducting path 430 of the second memory cell 416.

Accordingly, compensation parameters are calculated, such as by a compensation device (e.g., software, hardware, a finite state machine, a programmable CPU, fixed logic, a field programmable gate array (FPGA), or combination thereof), based upon positions of memory cells within the memory device 400 in order to compensate for varying lengths of conducting paths of memory cells. In an embodiment, an action, such as a read operation or a write operation, is to be performed upon the first memory cell 410. A position of the first memory cell 410 within the memory field is identified. In an embodiment, the position is identified based upon an address specified by the action. The address may correspond to the intersection of the first wordline 408 and the first bitline 402 at which the first memory cell 410 is located.

A compensation parameter is calculated based upon the position of the first memory cell 410. The compensation parameter comprises a calculated fixed electrical value. In an embodiment, the calculated fixed electrical value is calculated out of a set of calculated fixed electrical values. The calculated fixed electrical value is calculated in a digital domain. In an embodiment, the compensation parameter is calculated based upon a linear calculation and rounding operation to a fixed value. In an embodiment, the compensation parameter is calculated based upon a non-linear calculation and rounding operation to a fixed value. In an embodiment, historic operating information of the memory device 400 (e.g., temperature information, voltage differences between bitline and sourceline drivers, a current supplied to a memory cell at a particular location during execution of a read or write operation, whether a memory cell at a particular location was correctly programmed, etc.) is evaluated, such as utilizing machine learning functionality, to calculate the compensation parameter on the fly during operation of the memory device 400. In an embodiment, historic compensation information of the memory device 400 (e.g., previously utilized compensation parameters for memory cells at particular locations within the memory device 400, and whether actions were successfully performed when such compensation parameters were utilized) is evaluated, such as utilizing the machine learning functionality, to calculate the compensation parameter on the fly during operation of the memory device 400. In an embodiment, historic position information of memory cells within the memory device 400 is evaluated, such as utilizing the machine learning functionality, to calculate the compensation parameter on the fly during operation of the memory device 400.

Accordingly, the compensation parameter is applied to the action performed upon the first memory cell 410. In an embodiment, the compensation parameter is applied to a line (e.g., the first wordline 408, the first bitline 402, and/or the first sourceline 412) to modify a voltage applied to the line by the calculated fixed electrical value. In an embodiment, the compensation parameter is applied to the line to modify a current applied to the line by the calculated fixed electrical value. In an embodiment, the compensation parameter is applied to modify a wait time to perform the action by the calculated fixed electrical value.

In an embodiment, a list of actions may be performed upon the memory device 400 by an algorithm. A pointer to an action within the list of actions may be calculated (e.g., based upon a location/position of a memory cell targeted by the action). Execution of one or more actions within the list occurring before the action pointed to by the pointer may be skipped. That is, there may be a list of actions to perform such as to write to the memory device 400. The list may be referred to as an algorithm where different actions are performed one after the other until a desired state is reached (e.g., data is successfully written). A compensation parameter may be determined as a starting point within the list of actions (e.g., the compensation parameter may be the action to perform first, and actions above in the list are to be skipped). In an example, the actions above in the list are skipped because a memory cell on a top wordline is to be programmed, and some initial actions (e.g., actions occurring above the compensation parameter in the list) are too weak to have a suitable effect on the memory cell and thus are skipped and a "stronger" action lower in the list becomes the starting point.

In an embodiment, a second action is to be performed upon the second memory cell 416. A second position of the second memory cell 416 within the memory field is identified. In an embodiment, the second position is identified based upon an address specified by the action. The address may correspond to the intersection of the third wordline 404 and the second bitline 414 at which the second memory cell 416 is located. A second compensation parameter is calculated based upon the second position of the second memory cell 416. The second compensation parameter comprises a second calculated fixed electrical value. The second calculated fixed electrical value of the second compensation parameter may be different than the calculated fixed electrical value of the compensation parameter applied to the action performed upon the first memory cell 410 because the second position of the second memory cell 416 is different than the position of the first memory cell 410. That is, the second compensation parameter is tailored to compensate for the longer conducting path 430 of the second memory cell 416 and the compensation parameter is tailored to compensate for the shorter first conducting path 428 of the first memory cell 410.

Figure 5A:
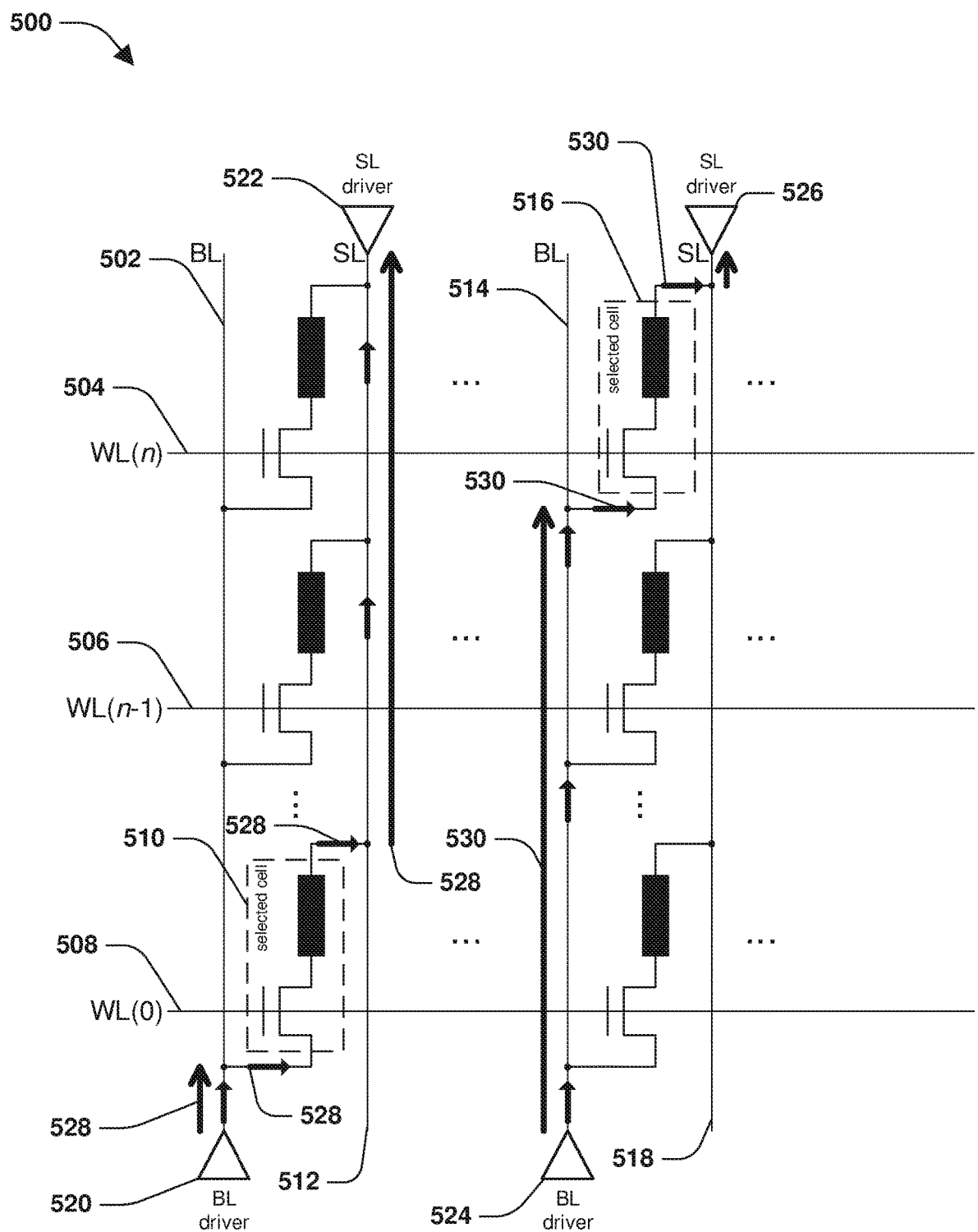
FIG. 5A is a component block diagram illustrating a memory device having an opposing two-sided connection of drivers.

FIG. 5A is an embodiment of a memory device 500 for which digital compensation may be provided for memory cells within the memory device 500. The memory device 500 is configured according to an opposing two-sided topology where bitline drivers and source drivers are located at different sides of the memory device 500, such as where a first bitline driver 520, a second bitline driver 524, and/or other bitline drivers are located at a first side of the memory device 500 (e.g., a bottom side of the memory device 500) and a first sourceline driver 522, a second sourceline driver 526, and/or other sourceline drivers are located at a second side of the memory device 500 (e.g., a top side of the memory device 500).

The memory device 500 comprises wordlines, bitlines, and/or and sourcelines connected to memory cells within a memory field of the memory device 500. In an embodiment, the memory device 500 comprises a first wordline 508, a second wordline 506, a third wordline 504, and/or other wordlines not illustrated. In an embodiment, the memory device 500 comprises a first bitline 502 connected to the first bitline driver 520, a second bitline 514 connected to the second bitline driver 524, and/or other bitlines not illustrated. In an embodiment, the memory device 500 comprises a first sourceline 512 connected to the first sourceline driver 522, a second sourceline 518 connected to the second sourceline driver 526, and/or other sourcelines not illustrated.

The memory device 500 comprises one or more memory fields of memory cells. In an embodiment, a memory field comprises a first memory cell 510 connected to the first wordline 508, the first bitline 502, and the first sourceline 512. The memory field comprises a second memory cell 516 connected to the third wordline 504, the second bitline 514, and the second sourceline 518. The memory field may comprise any number of memory cells.

Even though the length of conducting paths to different memory cells may be relatively the same due to the two-sided topology, resistances along the conducting paths may differ because bitlines and sourcelines may have different resistances and because conducting paths can include differing lengths of bitlines and different lengths of sourcelines. In an embodiment, a first conducting path 528 for the first memory cell 510 from the first bitline driver 520 to the first sourceline driver 522 encompasses a relatively short segment along the first bitline 502 and a relatively long segment along the first sourceline 512. In contrast, a second conducting path 530 for the second memory cell 516 from the second bitline driver 524 to the second sourceline driver 526 encompasses a relatively long segment along the second bitline 514 and a relatively short segment along the second sourceline 518. If the first bitline 502 and the second bitline 514 have different resistances than the first sourceline 512 and the second sourceline 518, then the first conducting path 528 will have a different resistance than the second conducting path 530, which must be taken into account when performing actions (e.g., achieving a target current when programming a memory cell) upon the first memory cell 510 and the second memory cell 516.

Accordingly, compensation parameters are calculated, such as by a compensation device (e.g., software, hardware, a finite state machine, a programmable CPU, fixed logic, a field programmable gate array (FPGA), or combination thereof), based upon positions of memory cells within the memory device 500 in order to compensate for varying resistances of conducting paths of memory cells. In an embodiment, an action, such as a read operation or a write operation, is to be performed upon the first memory cell 510. A position of the first memory cell 510 within the memory field is identified. In an embodiment, the position is identified based upon an address specified by the action. The address may correspond to the intersection of the first wordline 508 and the first bitline 502 at which the first memory cell 510 is located.

A compensation parameter is calculated based upon the position of the first memory cell 510. The compensation parameter comprises a calculated fixed electrical value. In an embodiment, the calculated fixed electrical value is calculated out of a set of calculated fixed electrical values. The calculated fixed electrical value is calculated in a digital domain. In an embodiment, the compensation parameter is calculated based upon a linear calculation and rounding operation to a fixed value. In an embodiment, the compensation parameter is calculated based upon a non-linear calculation and rounding operation to a fixed value. In an embodiment, historic operating information of the memory device 500 is evaluated, such as utilizing machine learning functionality, to calculate the compensation parameter on the fly during operation of the memory device 500. In an embodiment, historic compensation information of the memory device 500 is evaluated, such as utilizing the machine learning functionality, to calculate the compensation parameter on the fly during operation of the memory device 500. In an embodiment, historic position information of memory cells within the memory device 500 is evaluated, such as utilizing the machine learning functionality, to calculate the compensation parameter on the fly during operation of the memory device 500.

Accordingly, the compensation parameter is applied to the action performed upon the first memory cell 510. In an embodiment, the compensation parameter is applied to a line (e.g., the first wordline 508, the first bitline 502, and/or the first sourceline 512) to modify a voltage applied to the line by the calculated fixed electrical value. In an embodiment, the compensation parameter is applied to the line to modify a current applied to the line by the calculated fixed electrical value. In an embodiment, the compensation parameter is applied to modify a wait time to perform the action by the calculated fixed electrical value.

In an embodiment, a second action is to be performed upon the second memory cell 516. A second position of the second memory cell 516 within the memory field is identified. In an embodiment, the second position is identified based upon an address specified by the action. The address may correspond to the intersection of the third wordline 504 and the second bitline 514 at which the second memory cell 516 is located. A second compensation parameter is calculated based upon the second position of the second memory cell 516. The second compensation parameter comprises a second calculated fixed electrical value. The second calculated fixed electrical value of the second compensation parameter may be different than the calculated fixed electrical value of the compensation parameter applied to the action performed upon the first memory cell 510 because the second position of the second memory cell 516 is different than the position of the first memory cell 510. That is, the second compensation parameter is tailored to compensate for a resistance of the second conducting path 530 of the second memory cell 516 and the compensation parameter is tailored to compensate for a resistance of the first conducting path 528 of the first memory cell 510 because the resistances of the first conducting path 528 and the second conducting path 530 may differ.

Figure 5B:
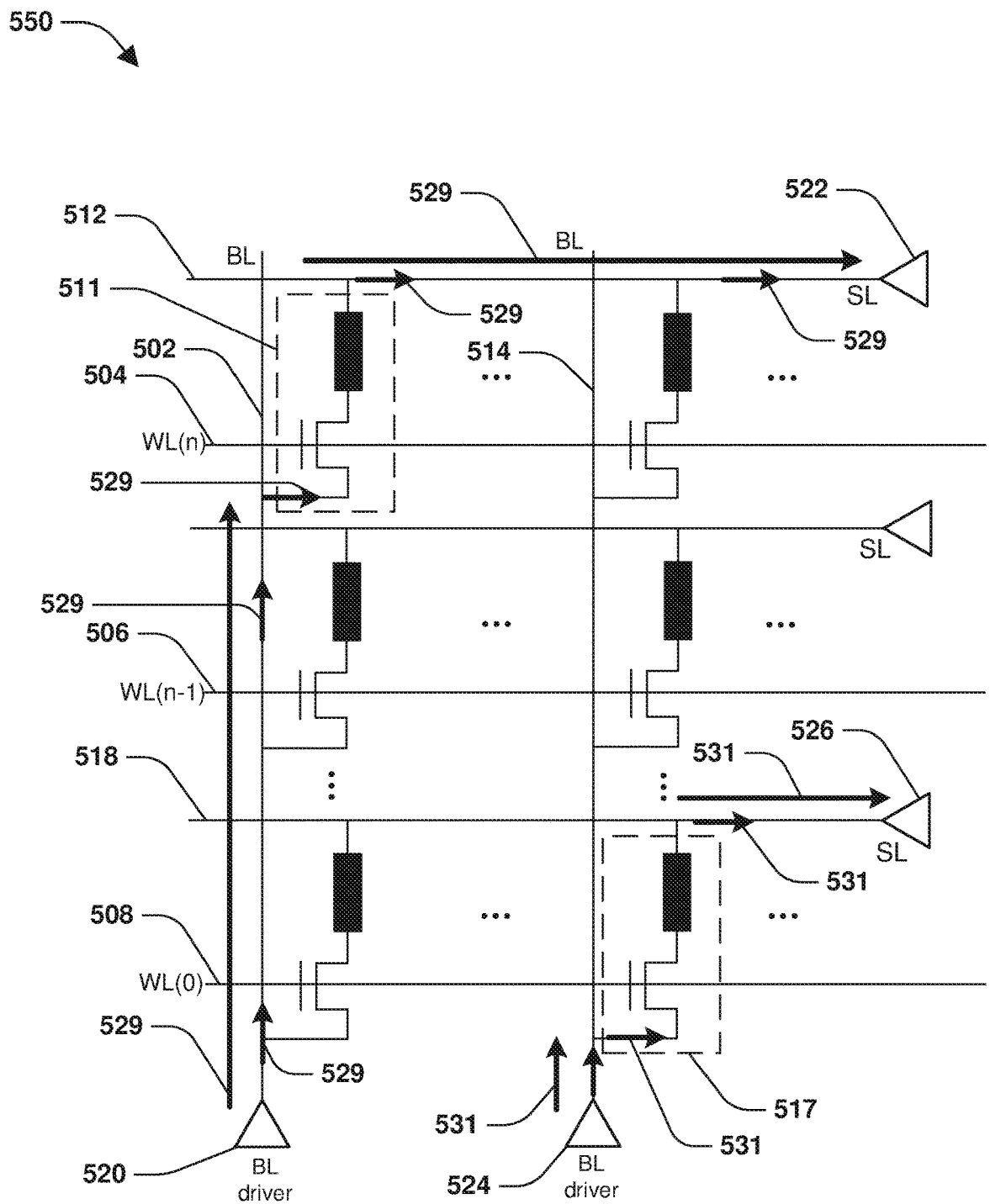
FIG. 5B is a component block diagram illustrating a memory device having an orthogonal two-sided connection of drivers.

FIG. 5B is an embodiment of a memory device 550 for which digital compensation may be provided for memory cells within the memory device 550. The memory device 550 is configured according to an orthogonal two-sided topology where bitlines (e.g., the first bitline 502 and the second bitline 514) and sourcelines (e.g., the first sourceline 512 and the second sourceline 518) are orthogonal to one another and thus the bitline drivers (e.g., the first bitline driver 520 and the second bitline driver 524) and the sourceline drivers (e.g., the first sourceline driver 522 and the second sourceline driver 526) are located at adjacent edges of the memory field, such as where the bitline drivers are located at the bottom side of the memory field and the sourceline drivers are located at a right side of the memory field.

A third conducting path 529 through a third memory cell 511 is relatively longer than a fourth conducting path 531 through a fourth memory cell 517. The third conducting path 529 is from the first bitline driver 520, through the third memory cell 511, to the first sourceline driver 522. The fourth conducting path 531 is from the second bitline driver 524, through the fourth memory cell 517, to the second sourceline driver 526. Accordingly, a third compensation parameter is applied to an action performed upon the third memory cell 511 (e.g., an action to program the third memory cell 511) based upon a position of the third memory cell 511. A fourth compensation parameter is applied to an action performed upon the fourth memory cell 517 (e.g., an action to program the fourth memory cell 517) based upon a position of the fourth memory cell 517. The third compensation parameter may be different than the fourth compensation parameter because the positions of the third memory cell 511 and the fourth memory cell 517 are different, and thus the different compensation parameters are applied in order to compensate for the difference in lengths of the third conducting path 529 of the third memory cell 511 and the fourth conducting path 531 of the fourth memory cell 517.

When performing an action upon a memory cell within a memory field, certain electrical characteristics, such as reaching a target current in order to change a state of a cell or applying a particular voltage difference between a bitline driver and a sourceline driver, must be achieved in order to correctly perform the action. For example, if a target current such as 300 uA is not achieved during programming of a memory cell to change a state of the memory cell, then the state of the memory cell may not be correctly changed. In order to achieve such electrical characteristics such as the target current, various factors must be taken into account. These factors can relate to differences in resistivity and length of conducting paths to memory cells. The differences in resistivity and length are a result of memory cells being located in different positions within a memory field.

Accordingly, operation of a memory device is improved by using compensation parameters to take into account the differences in resistivity and length of memory cells so that actions are correctly performed. Compensation parameters may be predefined and selected based upon positions of memory cells and/or regions of a memory field within which the memory cells are located. The compensation parameters may be calculated during (e.g., on the fly) operation of the memory device based upon positions of memory cells. The compensation parameters are defined/calculated within a digital domain in a fully automatic manner without the need for customer interaction. Thus, simple digital control can be used to compensate for positional differences of memory cells without the need for analog measurements, trimming, intervention of sensitive analog circuitry, etc. A compensation parameter may be applied to one or more lines, such as a wordline, a bitline, and/or a sourceline, connected to a memory cell for which an action (e.g., a read operation, a write operation, etc.) is to be performed. The compensation parameter may relate to a particular voltage step, current step, or time value step to use for performing the action.

The ability to compensate for resistivity and length differences of conducting paths to memory cells allows for relatively larger memory fields with longer lines, such as bitlines and sourcelines, to be built. Otherwise, the length of these lines would be limited by larger resistances of longer lines. More efficient memory devices can be built because a target memory capacity can be achieved with a smaller number of larger memory fields with less overhead for associated support circuitry than a larger number of smaller memory fields.

Still another embodiment involves a computer-readable medium comprising processor-executable instructions configured to apply the techniques presented herein. Such computer-readable media may include various types of communications media, such as a signal that may be propagated through various physical phenomena (e.g., an electromagnetic signal, a sound wave signal, or an optical signal) and in various wired scenarios (e.g., via an Ethernet or fiber optic cable) and/or wireless scenarios (e.g., a wireless local area network (WLAN) such as WiFi, a personal area network (PAN) such as Bluetooth, or a cellular or radio network), and which encodes a set of computer-readable instructions that, when executed by a processor of a device, cause the device to implement the techniques presented herein. Such computer-readable media may also include (as a class of technologies that excludes communications media) computer-readable memory devices, such as a memory semiconductor (e.g., a semiconductor utilizing static random access memory (SRAM), dynamic random access memory (DRAM), and/or synchronous dynamic random access memory (SDRAM) technologies), a platter of a hard disk drive, a flash memory device, or a magnetic or optical disc (such as a CD-R, DVD-R, or floppy disc), encoding a set of computer-readable instructions that, when executed by a processor of a device, cause the device to implement the techniques presented herein.

Figure 6:
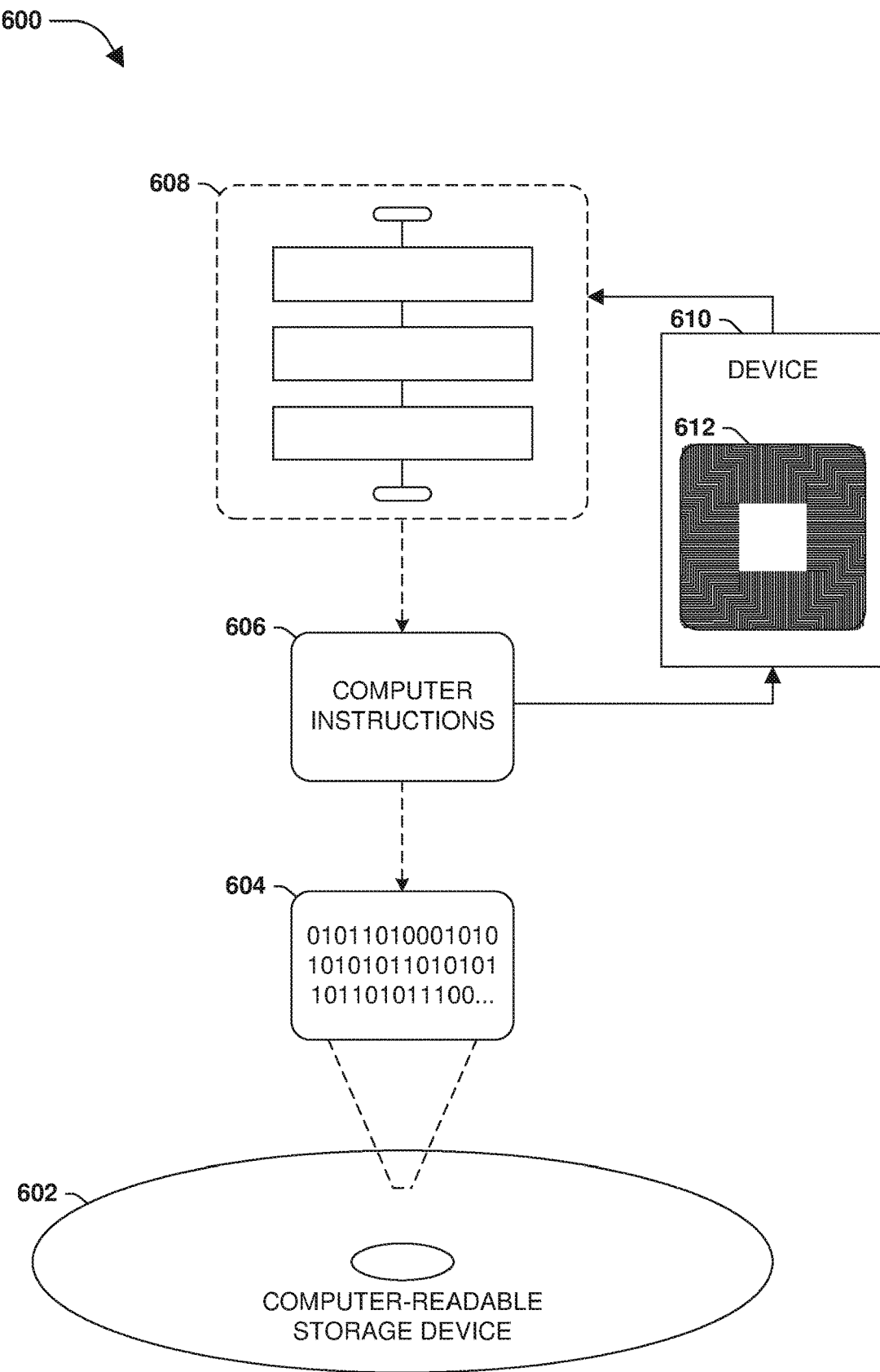
FIG. 6 is an example of a computer readable medium in which at least a portion of the currently presented techniques may be utilized.

An example computer-readable medium that may be devised in these ways is illustrated in FIG. 6, wherein the implementation 600 comprises a computer-readable memory device 602 (e.g., a CD-R, DVD-R, or a platter of a hard disk drive), on which is encoded computer-readable data 604. This computer-readable data 604 in turn comprises a set of computer instructions 606 that, when executed on a processor 612 of a device 610, provide an embodiment that causes the device 610 to operate according to the techniques presented forth herein. Many such computer-readable media may be devised by those of ordinary skill in the art that are configured to operate in accordance with the techniques presented herein. In some embodiments, the processor-executable computer instructions 606 are configured to perform a method 608, such as at least some of the exemplary method 100 of FIG. 1, for example. In some embodiments, the processor-executable computer instructions 606 are configured to implement a system, such as at least some of the exemplary memory device 200 of FIG. 2, at least some of the exemplary memory device 300 of FIG. 3A, at least some of the exemplary memory device 350 of FIG. 3B, at least some of the exemplary memory device 400 of FIG. 4, at least some of the exemplary memory device 500 of FIG. 5A, and/or at least some of the exemplary memory device 550 of FIG. 5B, for example. Many such computer-readable media are contemplated to operate in accordance with the techniques presented herein.

Figure 7:
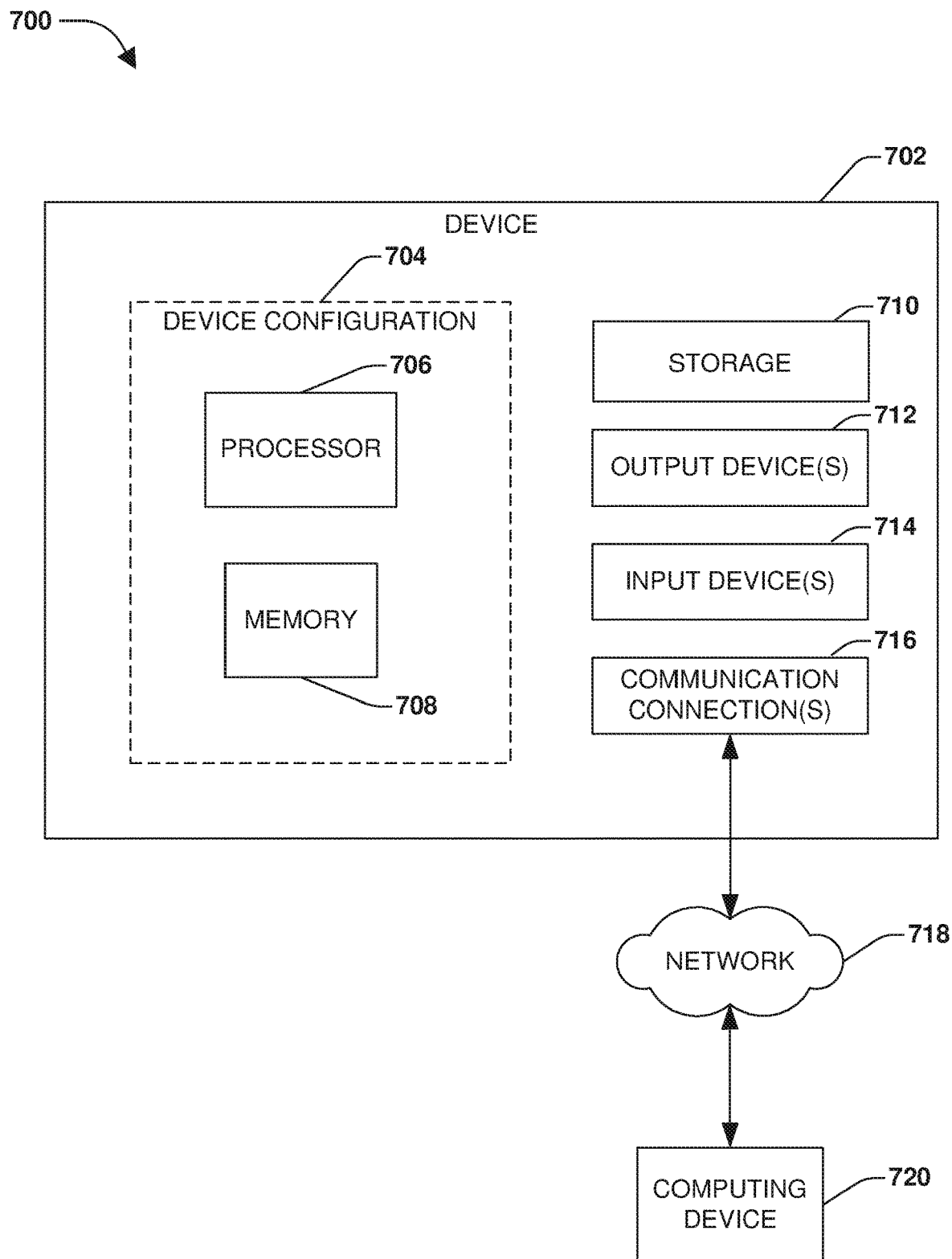
FIG. 7 is an illustration of an example computing environment wherein at least a portion of the currently presented techniques may be utilized.

FIG. 7 and the following discussion provide a brief, general description of a suitable computing environment to implement embodiments of one or more of the provisions set forth herein. The operating environment of FIG. 7 is only one example of a suitable operating environment and is not intended to suggest any limitation as to the scope of use or functionality of the operating environment. Example computing devices include, without limitation, personal computers, server computers, hand-held or laptop devices, mobile devices (such as mobile phones, Personal Digital Assistants (PDAs), media players, and the like), multiprocessor systems, consumer electronics, mini computers, mainframe computers, distributed computing environments that include any of the above systems or devices, and the like.

Although not required, embodiments are described in the general context of "computer readable instructions" being executed by one or more computing devices. Computer readable instructions may be distributed via computer readable media (discussed below). Computer readable instructions may be implemented as program modules, such as functions, objects, Application Programming Interfaces (APIs), data structures, and the like, that perform particular tasks or implement particular abstract data types. Typically, the functionality of the computer readable instructions may be combined or distributed as desired in various environments.

FIG. 7 illustrates an example 700 of a system comprising a computing device 702 configured to implement one or more embodiments provided herein. In one configuration, computing device 702 includes a processing unit 706 and memory 708. Depending on the exact configuration and type of computing device, memory 708 may be volatile (such as RAM, for example), non-volatile (such as ROM, flash memory, etc., for example), or some combination of the two. This configuration is illustrated in FIG. 7 by dashed line 704.

As provided herein, a sensing device can be employed for the memory 708 and/or storage 710 in order to improve the accuracy of reading cells within the memory 708 and/or the storage 710.

In some embodiments, device 702 may include additional features and/or functionality. For example, device 702 may also include additional storage (e.g., removable and/or non-removable) including, without limitation, magnetic storage, optical storage, and the like. Such additional storage is illustrated in FIG. 7 by storage 710. In one embodiment, computer readable instructions to implement one or more embodiments provided herein may be in storage 710. Storage 710 may also store computer readable instructions to implement an operating system, an application program, and the like. Computer readable instructions may be loaded in memory 708 for execution by processing unit 706, for example.

The term "computer readable media" as used herein includes computer storage media. Computer storage media includes volatile and nonvolatile, removable and non-removable media implemented in any method or technology for storage of information such as computer readable instructions or other data. Memory 708 and storage 710 are examples of computer storage media. Computer storage media includes, without limitation, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by device 702. Any such computer storage media may be part of device 702.

Device 702 may also include communication connection(s) 716 that allows device 702 to communicate with other devices. Communication connection(s) 716 may include, without limitation, a modem, a Network Interface Card (NIC), an integrated network interface, a radio frequency transmitter/receiver, an infrared port, a USB connection, or other interfaces for connecting device 702 to other computing devices.

Communication connection(s) 716 may include a wired connection or a wireless connection. Communication connection(s) 716 may transmit and/or receive communication media.

The term "computer readable media" may include communication media. Communication media typically embodies computer readable instructions or other data in a "modulated data signal" such as a carrier wave or other transport mechanism and includes any information delivery media. The term "modulated data signal" may include a signal that has one or more of its characteristics set or changed in such a manner as to encode information in the signal.

Device 702 may include input device(s) 714 such as keyboard, mouse, pen, voice input device, touch input device, infrared cameras, video input devices, and/or any other input device. Output device(s) 712 such as one or more displays, speakers, printers, and/or any other output device may also be included in device 702. Input device(s) 714 and output device(s) 712 may be connected to device 702 via a wired connection, wireless connection, or any combination thereof. In one embodiment, an input device or an output device from another computing device may be used as input device(s) 714 or output device(s) 712 for computing device 702.

Components of device 702 may be connected by various interconnects, such as a bus. Such interconnects may include a Peripheral Component Interconnect (PCI), such as PCI Express, a Universal Serial Bus (USB), Firewire (IEEE 1394), an optical bus structure, and the like. In an embodiment, components of device 702 may be interconnected by a network. For example, memory 708 may be comprised of multiple physical memory units located in different physical locations interconnected by a network.

Those skilled in the art will realize that storage devices utilized to store computer readable instructions may be distributed across a network. For example, a computing device 720 accessible via network 718 may store computer readable instructions to implement one or more embodiments provided herein. Computing device 702 may access the computing device 720 and download a part or all of the computer readable instructions for execution. Alternatively, computing device 702 may download pieces of the computer readable instructions, as needed, or some instructions may be executed at computing device 702 and some at computing device 720.

An embodiment of the presently disclosed techniques comprises a method. The method comprises identifying a position of a memory cell to be accessed within a memory field; identifying a region associated with the memory field within which the position is located; determining a compensation parameter from a set of compensation parameters comprising fixed electrical value steps for regions associated with the memory field based upon the compensation parameter corresponding to the region; and applying the compensation parameter to an action performed on a line connected to the memory cell during the access of the memory cell.

According to some embodiments, the line comprises a bitline connected to the memory cell.

According to some embodiments, the line comprises a sourceline connected to the memory cell.

According to some embodiments, the line comprises a wordline connected to the memory cell.

According to some embodiments, the access comprises a read operation to read a value from the memory cell.

According to some embodiments, the access comprises a write operation to write a value to the memory cell.

According to some embodiments, the determining comprises determining the compensation parameter based upon a temperature value associated with the memory field.

According to some embodiments, the determining comprises querying a lookup table, populated with the set of compensation parameters, using the region to determine the compensation parameter based upon the region.

According to some embodiments, the position comprises a first spatial position along a first spatial dimension, the region comprises a first spatial region, and the compensation parameter comprises a first spatial compensation parameter, and the method comprises: identifying a second spatial position of the memory cell along a second spatial dimension perpendicular to the first spatial dimension; identifying a second spatial region of the memory field within which the second spatial position is located; determining a second spatial compensation parameter based upon the second spatial region; and applying the second spatial compensation parameter to at least one of the first action performed on the first line or a second action performed on a second line connected to the memory cell.

According to some embodiments, the compensation parameter corresponds to at least one of voltage, current, or time.

An embodiment of the presently disclosed techniques comprises an apparatus, comprising a means for identifying a position of a memory cell to be accessed within a memory field; a means for identifying a region associated with the memory field within which the position is located; a means for determining a compensation parameter from a set of compensation parameters comprising fixed electrical value steps for regions associated with the memory field based upon the compensation parameter corresponding to the region; and a means for applying the compensation parameter to an action performed on a line connected to the memory cell during the access of the memory cell.

An embodiment of the presently disclosed techniques comprises a memory device. The memory device comprises a memory field comprising a plurality of memory cells and a compensation device configured to: identify a position of a memory cell to be accessed within the memory field; calculate a compensation parameter based upon the position, wherein the compensation parameter comprises a calculated fixed electrical value out of a set of calculated fixed electrical values; and apply the compensation parameter to an action performed on a line connected to the memory cell during access of the memory cell.

According to some embodiments, the compensation device is configured to perform a linear calculation and a rounding operation to a fixed value to calculate the compensation parameter.

According to some embodiments, the compensation device is configured to perform a non-linear calculation and a rounding operation to a fixed value to calculate the compensation parameter.

According to some embodiments, the compensation device is configured to evaluate at least one of historic operating information, historic compensation information, or historic position information of the plurality of memory cells utilizing machine learning functionality to calculate the compensation parameter on the fly during operation of the memory device.

An embodiment of the presently disclosed techniques comprises a method. The method comprises identifying a position of a memory cell to be accessed within a memory field of a memory device; determining a compensation parameter based upon the position, wherein the compensation parameter comprises a calculated fixed electrical value; and applying the compensation parameter to an action performed on a line connected to the memory cell during access of the memory cell.

According to some embodiments, the applying comprises applying the compensation parameter to a voltage applied to the line to modify the voltage.

According to some embodiments, the applying comprises applying the compensation parameter to a current applied to the line to modify the current.

According to some embodiments, the applying comprises applying the compensation parameter to modify a wait time to perform the action.

According to some embodiments, the method comprises calculating a pointer to an action within a list of actions of an algorithm to perform upon the memory device; and utilizing the pointer to the action as a starting point of the algorithm.

According to some embodiments, the method comprises skipping execution of one or more actions occurring within the list before the action.

An embodiment of the presently disclosed techniques comprises an apparatus, comprising a means for identifying a position of a memory cell to be accessed within a memory field of a memory device; a means for determining a compensation parameter based upon the position, wherein the compensation parameter comprises a calculated fixed electrical value; and a means for applying the compensation parameter to an action performed on a line connected to the memory cell during access of the memory cell.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used in this application, the terms "component," "module," "system", "interface", and the like are generally intended to refer to a computer-related entity, either hardware, a combination of hardware and software, software, or software in execution. One or more components may be localized on one computer and/or distributed between two or more computers.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

Various operations of embodiments are provided herein. In one embodiment, one or more of the operations described may constitute computer readable instructions stored on one or more computer readable media, which if executed by a computing device, will cause the computing device to perform the operations described. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

Any aspect or design described herein as an "example" is not necessarily to be construed as advantageous over other aspects or designs. Rather, use of the word "example" is intended to present one possible aspect and/or implementation that may pertain to the techniques presented herein. Such examples are not necessary for such techniques or intended to be limiting. Various embodiments of such techniques may include such an example, alone or in combination with other features, and/or may vary and/or omit the illustrated example.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form. Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated example implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method, comprising:
   identifying a position of a memory cell to be accessed within a memory field;
   identifying a region associated with the memory field within which the position is located;
   determining a voltage compensation parameter as a first discrete multiple of a fixed voltage value step and a timing compensation parameter as a second discrete multiple of a fixed time value step based upon the region of the memory field; and
   applying the voltage compensation parameter and the timing compensation parameter to an action performed on a line connected to the memory cell during the access of the memory cell.

2. The method of claim 1, wherein the determining comprises:
   querying a lookup table of compensation parameters using the region to identify the voltage compensation parameter and the timing compensation parameter as being mapped to the region.

3. The method of claim 1, wherein the determining comprises:
   determining the fixed voltage value step and the fixed time value step based upon the region.

4. The method of claim 1, wherein the line comprises at least one of a wordline, a bitline, or a sourceline connected to the memory cell.

5. The method of claim 1, wherein the access comprises a read operation to read a value from the memory cell.

6. The method of claim 1, wherein the access comprises a write operation to write a value to the memory cell.

7. The method of claim 1, wherein the determining comprises:
  determining at least one of the timing compensation parameter or the voltage compensation parameter based upon a temperature value associated with the memory field.

8. The method of claim 1, wherein the determining comprises:
  querying a lookup table, populated with compensation parameters as fixed value steps within a digital domain, using the region to determine at least one of the timing compensation parameter or the voltage compensation parameter based upon the region.

9. The method of claim 1, wherein the position comprises a first spatial position along a first spatial dimension, the region comprises a first spatial region, and at least one of the timing compensation parameter or the voltage compensation parameter comprises a first spatial compensation parameter, and wherein the method comprises:
  identifying a second spatial position of the memory cell along a second spatial dimension perpendicular to the first spatial dimension;
  identifying a second spatial region of the memory field within which the second spatial position is located;
  determining a second spatial compensation parameter based upon the second spatial region; and
  applying the second spatial compensation parameter to a second action performed on at least one of the line connected to the memory cell or a second line connected to the memory cell.

10. The method of claim 1, wherein the determining comprises:
  selecting the timing compensation parameter, from a set of timing compensation parameters corresponding to regions within the memory field, based upon the timing compensation parameter corresponding to the region, wherein the set of timing compensation parameters correspond to fixed time value steps.

11. A memory device comprising:
  a memory field comprising a plurality of memory cells; and
  a compensation device configured to:
    identify a position of a memory cell to be accessed within the memory field;
    calculate a voltage compensation parameter as a discrete multiple of a fixed voltage value step and a timing compensation parameter as a discrete multiple of a fixed time value step based upon the position; and
    apply the voltage compensation parameter and the timing compensation parameter to an action performed on a line connected to the memory cell during access of the memory cell.

12. The memory device of claim 11, wherein the compensation device is configured to:
  perform a linear calculation and a rounding operation to a fixed value to calculate at least one of the fixed voltage value step or the fixed time value step.

13. The memory device of claim 11, wherein the compensation device is configured to:
  perform a non-linear calculation and a rounding operation to a fixed value to calculate at least one of the fixed voltage value step or the fixed time value step.

14. The memory device of claim 11, wherein the compensation device is configured to:
  evaluate at least one of historic operating information, historic compensation information, or historic position information of the plurality of memory cells utilizing machine learning functionality to calculate at least one of the fixed voltage value step or the fixed time value step on the fly during operation of the memory device.

15. A method comprising:
  identifying a position of a memory cell to be accessed within a memory field of a memory device;
  determining a voltage compensation parameter and a timing compensation parameter based upon the position, wherein the voltage compensation parameter and the timing compensation parameter comprise calculated discrete multiples of fixed value steps; and
  applying the voltage compensation parameter and the timing compensation parameter to an action performed on a line connected to the memory cell during access of the memory cell.

16. The method of claim 15, wherein the applying comprises:
  applying the voltage compensation parameter to a voltage applied to the line to modify the voltage.

17. The method of claim 15, wherein the determining comprises:
  selecting the timing compensation parameter, from a set of timing compensation parameters corresponding to positions within the memory field, based upon the timing compensation parameter corresponding to the position, wherein the set of timing compensation parameters correspond to fixed time value steps.

18. The method of claim 15, wherein the applying comprises:
  applying the timing compensation parameter to modify a wait time to perform the action.

19. The method of claim 15, comprising:
  calculating a pointer to the action within a list of actions of an algorithm to perform upon the memory device; and
  utilizing the pointer to the action as a starting point of the algorithm.

20. The method of claim 19, comprising:
  skipping execution of one or more actions occurring within the list before the action.

* * * * *